(12) United States Patent
Gravrand et al.

(10) Patent No.: US 9,165,967 B2
(45) Date of Patent: Oct. 20, 2015

(54) SEMICONDUCTOR STRUCTURE ABLE TO RECEIVE ELECTROMAGNETIC RADIATION, SEMICONDUCTOR COMPONENT AND PROCESS FOR FABRICATING SUCH A SEMICONDUCTOR STRUCTURE

(71) Applicant: COMMISSARIAT A L'ENERGIE ATOMIQUE ET AUX ENE ALT, Paris (FR)

(72) Inventors: Olivier Gravrand, Fontanil Cornillon (FR); Gerard Destefanis, Saint-Egreve (FR)

(73) Assignee: Commissariat á l'énergies atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/359,369

(22) PCT Filed: Nov. 27, 2012

(86) PCT No.: PCT/EP2012/073710
§ 371 (c)(1),
(2) Date: May 20, 2014

(87) PCT Pub. No.: WO2013/079475
PCT Pub. Date: Jun. 6, 2013

(65) Prior Publication Data
US 2014/0312446 A1    Oct. 23, 2014

(30) Foreign Application Priority Data

Nov. 29, 2011 (FR) ...................... 11 60900

(51) Int. Cl.
*H01L 27/146* (2006.01)
*H01L 31/103* (2006.01)
(Continued)

(52) U.S. Cl.
CPC ...... *H01L 27/1463* (2013.01); *H01L 27/14649* (2013.01); *H01L 31/02327* (2013.01); *H01L 31/102* (2013.01); *H01L 31/1032* (2013.01); *H01L 31/18* (2013.01)

(58) Field of Classification Search
CPC ................... H01L 27/14603; H01L 27/14652; H01L 31/1013
USPC ........................................... 257/21, E31.032
See application file for complete search history.

(56) References Cited

U.S. PATENT DOCUMENTS 4,875,084 A    10/1989   Tohyama
6,034,407 A *   3/2000   Tennant et al. ............... 257/440
(Continued)

FOREIGN PATENT DOCUMENTS

WO    2010/140621    12/2010

OTHER PUBLICATIONS

U.S. Appl. No. 14/402,020, filed Nov. 18, 2014, Boulard, et al.
(Continued)

*Primary Examiner* — John C Ingham
(74) *Attorney, Agent, or Firm* — Oblon, McClelland, Maier & Neustadt, L.L.P.

(57) ABSTRACT

A semiconducting structure configured to receive electromagnetic radiation and transform the received electromagnetic radiation into an electric signal, the semiconductor structure including a semiconducting support within a first surface defining a longitudinal plane, a first zone with a first type of conductivity formed in the support with a second zone with a second type of conductivity that is opposite of the first type of conductivity to form a semiconducting junction. A mechanism limiting lateral current includes a third zone formed in the support in lateral contact with the second zone, the third zone having the second type of conductivity for which majority carriers are electrons. The third zone has a sufficient concentration of majority carriers to have an increase in an apparent gap due to a Moss-Burstein effect.

15 Claims, 3 Drawing Sheets

(51) Int. Cl.
*H01L 31/0232* (2014.01)
*H01L 31/102* (2006.01)
*H01L 31/18* (2006.01)

(56) References Cited

U.S. PATENT DOCUMENTS

| | | | | |
|---|---|---|---|---|
| 7,608,830 | B1* | 10/2009 | Kinch | 250/370.06 |
| 2003/0227064 | A1 | 12/2003 | Maeda | |
| 2007/0029485 | A1* | 2/2007 | Beck et al. | 250/338.4 |
| 2009/0236525 | A1* | 9/2009 | Mitra et al. | 250/338.4 |
| 2011/0031401 | A1* | 2/2011 | Mitra et al. | 250/338.4 |
| 2012/0061785 | A1 | 3/2012 | Ishikawa et al. | |

OTHER PUBLICATIONS

International Search Report issued Jan. 4, 2013, in PCT/EP12/073710, filed Nov. 27, 2012.

French Search Report issued Sep. 26, 2012 in FR 1160900 filed Nov. 29, 2011.

Zha, F. X. et al., "The Blue-shift effect of the ion-milling-formed HgCdTe photodiodes", Proc. of SPIE, vol. 6984, pp. 69840G1-69840G-4, 2008, XP 055039157.

Baker, I. M. et al., "Summary of HgCdTe 2 D Array Technology in the U. K.", Journal of Electronic Materials, vol. 30, No. 6, pp. 682-689, XP 055039154, 2001.

U.S. Appl. No. 14/370,581, filed Jul. 3, 2014, Gravrand, et al.

K. Jozwikowski, et al. "Generation-Recombination Effect in High-Temperature HgCdTe Heterostructure Nonequilibrium Photodiodes", Journal of Electronic Materials, vol. 38, No. 8, (2009), pp. 1666-1676.

H.F. Schaake, et al. "High-Operating-Temperature MWIR Detector Diodes", Journal of Electronic Materials, vol. 37, No. 9, (2008), pp. 1401-1405.

U.S. Appl. No. 14/420,814, filed Feb. 10, 2015, Boulard, et al.

\* cited by examiner

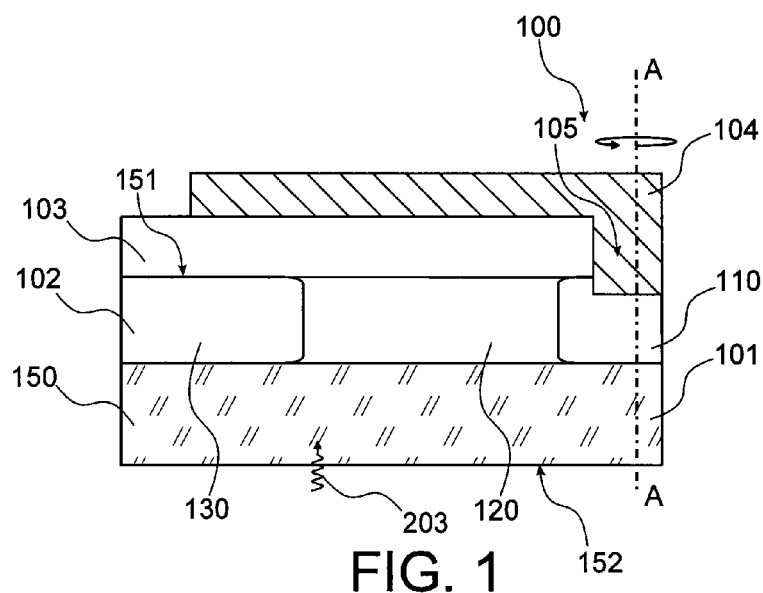
FIG. 1
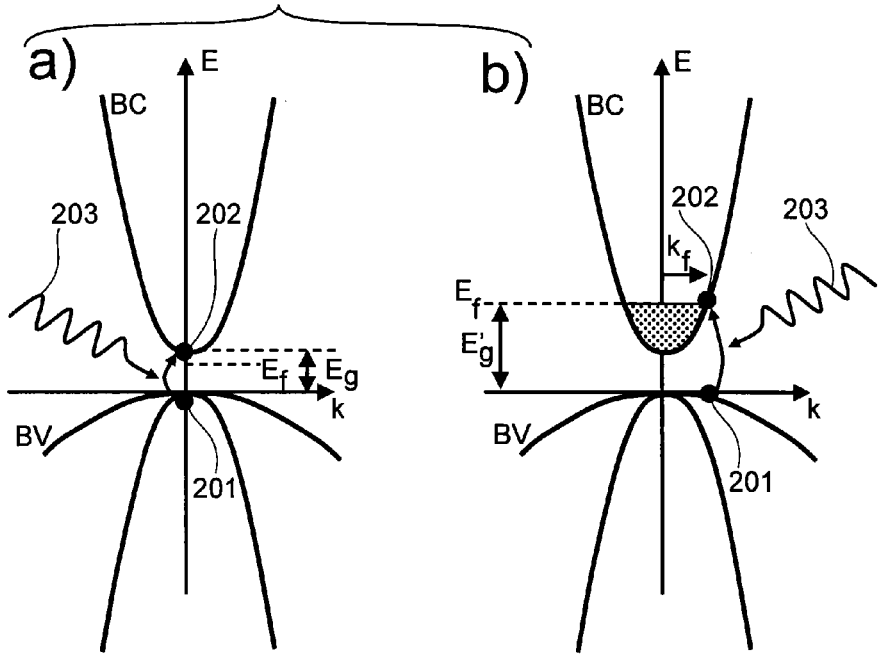

SEMICONDUCTOR STRUCTURE ABLE TO RECEIVE ELECTROMAGNETIC RADIATION, SEMICONDUCTOR COMPONENT AND PROCESS FOR FABRICATING SUCH A SEMICONDUCTOR STRUCTURE

TECHNICAL FIELD

The invention relates to the field of detection and/or measurement of electromagnetic radiation and to devices for such detection and/or measurement.

Fast changes in optoelectronics related to the adaptation of microelectronics technologies to direct gap semiconductors has made it possible to install compact devices for measurement and/or detection of electromagnetic radiation, within wavelengths range varying from the ultraviolet to the infrared.

These devices generally use semiconducting structures capable of receiving electromagnetic radiation and transforming it into an electrical signal.

The invention is more particularly related to a semiconducting structure capable of receiving an electromagnetic radiation and transforming it into an electrical signal, to a semiconducting component comprising at least one such semiconducting structure and a process for fabrication of such a semiconducting structure.

STATE OF PRIOR ART

Semiconducting structures capable of receiving electromagnetic radiation and transforming it into an electrical signal usually comprise a semiconducting support in which a first and a second zone are formed in contact with each other, and with a first type of conductivity in one zone and a second inverse type of conductivity in the other zone. In this way, the first and second zones together form a semiconducting junction at their contact.

Thus, for a support for which the semiconducting material is a direct gap semiconducting material and inverse polarisation of the junction, when a photon with an energy greater than the energy of the band gap of the semiconducting material penetrates the semiconducting junction, it will generate an electron-hole pair and therefore a current in the junction. This current, being directly proportional to the electromagnetic radiation, provides a measurement of this electromagnetic radiation.

A direct gap semiconducting material is a semiconducting material for which the value of the maximum energy in the valency band and the value of the minimum energy in the conduction band are associated with an approximately equal value of the wave vector k in the energy dispersion diagram of said semiconducting material.

Although such a technology is well adapted for detection and measurement of electromagnetic radiation in the visible wavelength range, it has a number of limitations for use dedicated to the measurement of electromagnetic radiation with wavelengths range within the infrared range. For detection of such radiation, the energy of the band gap must be less than the energy of the electromagnetic radiation to be detected, in other words less than 250 meV for a wavelength of 5 µm. This low energy of the band gap is close to the energy corresponding to thermal agitation at ambient temperature that is about 25 meV.

Therefore, the result is that a structure adapted for detection of electromagnetic radiation in the infrared wavelengths range, when used at ambient temperature, has a dark current, in other words a junction current in the lack of any high value electromagnetic radiation, this current being caused by the generation of electron-hole pairs related to thermal agitation, particularly due to the Auger recombination phenomenon. Since this dark current has a direct influence on the signal to noise ratio of the structure and therefore the sensitivity of the structure, it has to be reduced. This is usually done by keeping the semiconducting structure at a low temperature during operation, typically less than −150° C.

Another limitation of such structures is crosstalk between the structures in a specific component. Due the large diffusion length of minority carriers, more than one micrometer, structures can interact with each other thus reducing the spatial resolution of the component.

When the support of the structure is chosen to be transparent to the electromagnetic radiation to be detected and/or measured, the main source of dark current is the zones around the periphery of the junction that are therefore lateral relative to the surface of the support.

One known means of reducing this dark current originating from the lateral diffusion of minority carriers generated mainly by the Auger recombination phenomenon at the periphery of the junction, is to use the information provided by Jozwikowsky [1] and Schaake [2], to make the junction within a mesa [1], or a structure for which the lateral dimensions are limited in space [2]. Thus, for example in the case of a mesa, the periphery of the junction is made insulating by the presence of an air layer, eliminating all possibility of electron-hole pairs being created in this peripheral zone.

Furthermore, the central zone in which photo-generation is done is usually depleted of all free carriers under the action of a potential difference at its terminals. Since the Auger recombination is a phenomenon with several carriers, the lack of free carriers eliminates this source of recombination in the central zone, thus reducing the dark current in the resulting junction.

Nevertheless, although such a process can eliminate the possibility of thermal electron-hole pairs and particularly Auger pairs from being generated in the peripheral zone and also in the central zone, it requires mesa and/or structure flank passivation operations in order to limit the dark current originating from the semiconductor-air interface. Due to the orientation of the flanks, these operations remain difficult and usually expensive to implement.

PRESENTATION OF THE INVENTION

This invention is aimed at overcoming these disadvantages.

One of the purposes of the invention is to provide a semiconducting structure capable of receiving electromagnetic radiation and transforming it into an electric signal which, when this structure is adapted to receive electromagnetic radiation with a wavelength within the infrared range, has a low dark current at ambient temperature in comparison with a semiconducting structure according to prior art, and which, when used through a component comprising a plurality of semiconducting structures, does not introduce a significant crosstalk phenomenon, without requiring any etching and passivation operation of the etching flanks to form at least part of the lateral current limitation means.

Another purpose of the invention is to provide a semiconducting structure adapted to function with a system facing the first surface of the support for concentration of electromagnetic radiation.

To achieve this, the invention relates to a semiconducting structure capable of receiving electromagnetic radiation and transforming it into an electric signal, such a semiconducting structure comprising:

a semiconducting support with a first and a second surface, the first surface defining a longitudinal plane, a first zone with a first type of conductivity formed in the support, a second zone with a second type of conductivity that is opposite of the first type of conductivity, the second zone being formed in the support in contact with the first zone so as to form a semiconducting junction with the first zone, a means of limiting the lateral current adapted to limit the junction current that originates laterally to the longitudinal plane, said means of limiting the lateral current at least partially surrounding the junction.

The means of limiting the lateral current comprises a third zone formed in the support in lateral contact with the second zone, said third zone has the second type of conductivity, the second type of conductivity being a conductivity for which majority carriers are electrons, the third zone having a sufficient concentration of majority carriers to have an increase in the apparent gap due to a Moss-Burstein effect.

In the above and throughout the remainder of this document, a "sufficient concentration of majority carriers to have an increase in the apparent gap due to a Moss-Burstein effect" means that the concentration of majority carriers is such that the energy of the Fermi Ef level is greater than the energy at the bottom of the conduction band.

In the above and in the remainder of this document, "second type of conductivity opposite to the first type of conductivity" means that the majority carriers of the second type of conductivity have an electric charge opposite to the electric charge of the majority carriers in the first type of conductivity.

Such a third zone has a low concentration of minority carriers due to its strong concentration of majority carriers necessary to obtain a Moss-Burstein effect. Thus, the probability of generation of thermal electron-hole pairs, originating particularly from the Auger recombination, is reduced and this generation is strongly contained. Since this third zone contains no photo-generated electron-hole pairs at the wavelength to be detected and/or measured, the apparent gap being larger than for the material forming the junction, there is no possibility of a parasite current that could generate a signal in another structure, being created in this third zone. Therefore crosstalk is also reduced.

The first type of conductivity may be a conductivity type for which majority carriers are holes, the second type of conductivity then being a conductivity type for which majority carriers are holes.

The semiconducting structure is preferably a semiconducting structure adapted for the measurement and/or detection of electromagnetic radiation in the infrared range, this adaptation preferably being obtained by making the second zone in the material with a band gap energy of less than 0.85 eV.

Furthermore, since the effect of the Moss-Burstein effect is to increase the apparent gap of the material forming the third zone, the electromagnetic radiation to be detected passing through the third zone may be directed to an electromagnetic radiation concentration system adapted to return this radiation to the junction and thus increase the signal to noise ratio.

The third zone may be in contact with the second zone over the entire thickness of the second zone.

The third zone may surround the junction. Thus, the third zone can limit the original lateral dark current around the entire periphery of the junction.

There may also be a fourth zone in contact with the first zone and with the same type of conductivity as the first zone, the fourth zone having a higher concentration of majority carriers than the first zone.

With such a fourth zone providing a means of polarisation of the first zone, the concentration of majority carriers in the first zone may be reduced to enable the formation of an extended junction and less abrupt with the second zone, ideal for detection of electromagnetic radiation. The second zone may surround the first zone, and the third zone surrounds the second zone.

Such a configuration can give a planar type junction, in other words a junction with a plane surface.

The first zone and the second zone are in contact on an approximately longitudinal junction plane.

The first zone and the second zone are in significantly different longitudinal planes, the contact of the first zone with the second zone being made on an approximately longitudinal junction plane.

In this case, the junction is present on an approximately longitudinal plane on a surface that may be equivalent to the surface of the first zone.

The first, second and third zones are formed in a support layer said to be active, the active layer comprising the first surface of the semiconducting support and the first zone being at a distance from the face of the active layer opposite the first surface of the semiconducting support, the semiconducting structure also comprising a so-called confinement layer formed in the semiconducting support in longitudinal contact with the active layer on a face of the active layer opposite the first surface of the semiconducting support, said confinement layer having the second type of conductivity, the confinement layer having a sufficient concentration of majority carriers to have an increase in the apparent gap due to a Moss-Burstein effect.

Such a confinement layer can limit the dark current originating from the part of the support under the active layer. Furthermore, if this confinement layer is made from a material similar to the material of the active layer, since it is at the interface between the substrate and the active layer, it makes it possible to adapt the mesh parameter and to reduce risks of crystalline defects in the active layer. The structure may include a means of electric polarisation of the first zone, said polarisation means being formed on the first surface, the second surface being adapted to receive electromagnetic radiation.

Such a polarisation means can polarise the junction on the first surface without any interaction with the electromagnetic radiation to be detected, since this radiation is received on the second surface.

The first and the second zones may each be made from a semiconducting material different from the material used for the other zone among the first and second zones such that the structure forms a heterostructure.

Such a configuration enables the first and the second zones to have a different band gap width from each other, thus providing the possibility of increasing the band gap width if either the first or the second zone is not intended to receive the electromagnetic radiation, so as to limit the dark current generated in said zone.

At least one of the zones among the first, second and third zones may be made from a semiconducting material selected from among InSb and semiconductors of the $InAs_{1-x}Sb_x$, $InAl_{1-x}Sb_x$ and $Cd_xHg_{1-x}Te$ type where x is between 0 and 1.

Such materials have a direct gap with a band gap width adapted for the detection of electromagnetic radiation in the infrared.

The invention is also related to a semiconducting component comprising a semiconducting support on which a plurality of semiconducting structures is formed, at least one of the semiconducting structures being a semiconducting structure according to the invention.

Such a semiconducting component, for at least one of the semiconducting structures according to the invention formed in its support, has a low intensity dark current when said semiconducting structure(s) is (are) adapted to detect and/or measure electromagnetic radiation in the infrared range, and reduced crosstalk for this or these semiconducting structure(s).

All semiconducting structures may be semiconducting structures according to the invention, the third zones of the structures being in contact with each other.

Such contact between the third zones of semiconducting structures can polarise the second zones of structures by means of a single contact made on at least one of the third zones, these third zones having a high conductivity due to the strong concentration of majority carriers necessary to obtain the Moss-Burstein effect.

A means of concentrating electromagnetic radiation adapted to concentrate the electromagnetic radiation received by the semiconducting component on the semiconducting junction may also be provided, said means preferably being formed in the semiconducting component facing the first surface of the semiconducting support.

Such a means of concentrating the electromagnetic radiation enables concentration of the electromagnetic radiation received by part of the component on the junction of one of the semiconducting structures. The increase in the electromagnetic radiation flux on the junction can increase the signal related to the measurement, thus reducing the influence of the dark current.

The invention also relates to a process for fabricating a semiconducting structure, said process being adapted for fabrication of a semiconducting structure according to the invention, said process including steps to:

provide a semiconducting support, form a first zone with a first type of conductivity in the semiconducting support, form a second zone of a second type of conductivity, of which the majority carriers are electrons, in the support in contact with the first zone so as to form a semiconducting junction, form a third zone of the second type of conductivity, in lateral contact with the second zone, the concentration of said third zone being sufficient to have a Moss Burstein effect, said third zone at least partially surrounding the semiconducting junction.

The process may be adapted to make a semiconducting junction in which the second zone surrounds the first zone, the third zone surrounding the second zone, steps for formation of the first and second zones being made simultaneously by forming the first zone in a support layer with the concentration of the type of the second zone.

The process may be adapted to form a semiconducting structure in which the first zone and the second zone are in significantly different longitudinal planes, the contact of the first zone on the second zone being made on an approximately longitudinal junction plane, the step in which the first layer is formed including a step to etch a formation layer of the first layer in contact with the portion of the second layer so as to form the semiconducting junction.

Such a process enables fabrication of a semiconducting structure that, when adapted for detection and/or measurement of electromagnetic radiation in the infrared range, has a small dark current, and for a semiconducting structure for which the support comprises several semiconducting structures, has low crosstalk with adjacent semiconducting structures.

BRIEF DESCRIPTION OF THE DRAWINGS

This invention will be better understood after reading the description of example embodiments given purely for information and in no way limitative, with reference to the appended drawings among which:

FIG. 1 diagrammatically shows a section through a structure according to a first embodiment of the invention, the semiconducting structure being a structure of revolution around the A-A axis, FIGS. 2a and 2b diagrammatically show the Moss-Burstein phenomenon, FIG. 2a showing the phenomenon of creation of an electron-hole pair with a semiconducting material without a Moss-Burstein effect and FIG. 2b showing this same phenomenon for a material with a Moss-Burstein effect.

Figure 3:
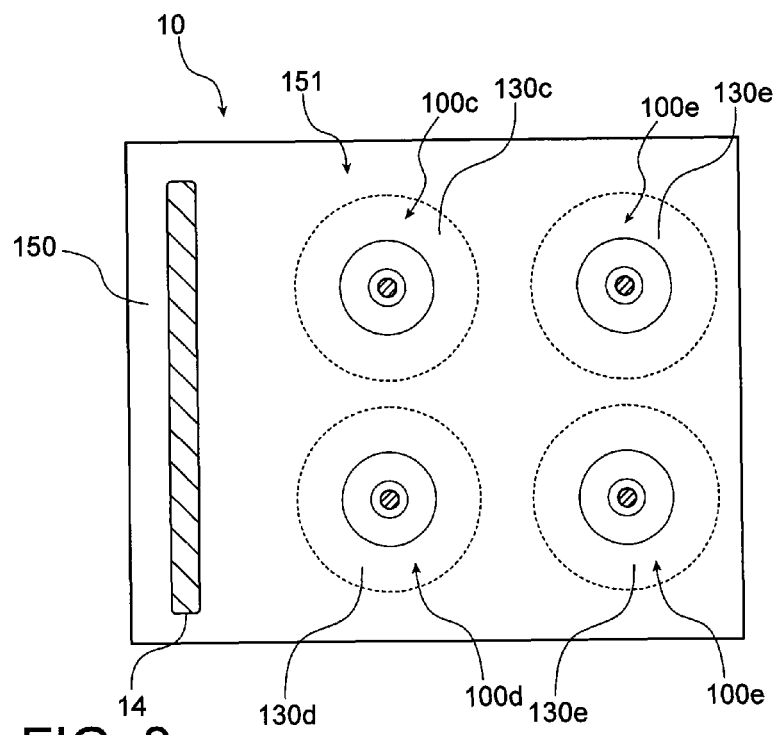
FIG. 3 shows a component comprising 4 structures like that shown in FIG. 1, FIG. 4 diagrammatically shows a section through a structure according to a second embodiment of the invention in which the first zone and the second zone are in different planes, the junction being parallel to the plane of the surface of the support, the semiconducting structure being a structure of revolution about the B-B axis, FIG. 5 diagrammatically shows a section through a structure according to a third embodiment in which the first and the second zones are in lateral and longitudinal contact and in which a confinement layer is also provided.

Identical, similar or equivalent parts of the different figures have the same numeric references so as to facilitate comparison of different figures.

The different parts shown in the figures are not necessarily at the same scale, to make the figures more easily understandable.

The different possibilities (variants and embodiments) must be understood as not being exclusive, and they can be combined together.

DETAILED PRESENTATION OF PARTICULAR EMBODIMENTS

FIG. 1 illustrates a first embodiment of a semiconducting structure 100 capable of receiving electromagnetic radiation and transforming it into an electrical signal.

Such a structure uses the Moss-Burstein effect to limit the dark current of the structure.

FIGS. 2a and b diagrammatically show the creation of an electron-hole pair 202-201 in a semiconducting material without such a Moss-Burstein effect and a semiconducting material with said effect respectively, the two materials being direct gap semiconducting materials.

Thus, FIG. 2a diagrammatically shows the distribution of energy levels for a semiconducting material with a conductivity in which the majority carriers are electrons 202 and for which the concentration of majority carriers is such that the Fermi energy Ef is present in the band gap of the semiconducting material. For such a material, a photon 203 with energy slightly higher than the energy of the band gap Eg, may excite an electron 202 as shown in FIG. 2a to make it pass from the valency band BV to the conduction band BC and thus create an electron-hole pair 202-201. This electron-hole pair 202-201, for an inversely polarised semiconducting junction, is additional to the junction current indicating that a photon 203 with energy equal to at least the energy corresponding to the band gap has been detected.

For FIG. 2b, the semiconducting material is a semiconducting material for which the conductivity is such that the Fermi energy Ef is in the conduction band BC. With such conductivity, the semiconducting material is said to be degenerated, in other words it has an electric behaviour similar to the behaviour of a metallic material.

In such a configuration, as shown in FIG. 2b, as a first approximation, the conduction band may be considered to be populated up to the Fermi energy Ef. Thus, an electron 202 that could be excited by a photon 203 with energy of the same order as the energy of the band gap Eg, will not be capable of reaching the bottom of the conduction band BC, since the bottom of the conduction band BC is already occupied. Therefore, an electron-hole pair 202-201 in such a semiconducting material can only be generated if the energy transmitted by the photon 203 to the electron 202 is equal to at least the Fermi energy Ef from which the energy of the peak of the valency band BV has been subtracted.

Therefore, the result is that a semiconducting material with a Moss-Burstein phenomenon is transparent to the electromagnetic radiation for which the wavelength corresponds to the band gap energy Eg and is capable of absorbing electromagnetic radiation for which the wavelength corresponds to an energy higher than the Fermi energy Ef from which the energy of the peak of the valency band BV has been subtracted. Thus, the energy value corresponding to the Fermi energy Ef from which the energy of the peak of the valency band EV has been subtracted is the energy of the apparent optical gap Eg' at which the material becomes absorbent for electromagnetic radiation.

Similarly, as indicated above, a semiconducting material with such a Moss-Burstein effect is a degenerated semiconducting material, in other words it has a high concentration of majority carriers and therefore a low concentration of minority carriers. The presence of an apparent optical gap, increasing the energy necessary to generate an electron-hole pair 202-201 in combination with a low concentration of minority carriers, strongly reduces thermal generation of electron-hole pairs 202-201 in the semiconducting material and therefore the dark current.

The semiconducting structure 100 shown in FIG. 1 makes use of this Moss-Burstein effect to reduce the dark current in the semiconducting structure 100 and provide a semiconducting structure 100 capable of receiving electromagnetic radiation and transforming it into an electric signal, with a sensitivity only slightly affected by the dark current at ambient temperature.

Such a semiconducting structure 100 comprises:
 a semiconducting support 150 with a first and second surface 151, 152, the first surface 151 defining a longitudinal plane. The support has a first layer 101 called the substrate and a so-called active layer 102,
 a first zone 110 with a first type of conductivity formed in the active layer 102,
 a second zone 120 of a second type of conductivity that is opposite of the first type of conductivity, the second zone being formed in the active zone 102 in contact with the first zone 110 so as to form a semiconducting junction with the first zone 110,
 a third zone 130 with the second type of conductivity, the conductivity being such that the semiconducting material of the third zone 130 has a Moss-Burstein effect, said third zone being formed in the active layer 102,
 a passivation layer 103, and
 a polarisation pad 104 in electrical contact with the first zone 110.

The semiconducting structure 100, as shown in FIG. 1, is a semiconducting structure with a symmetry of revolution about an axis of revolution A-A.

The support 150 is an approximately plane shaped support made of semiconducting material. The support 150 has a first surface 151 to be used for the electrical connection of the semiconducting structure 100 and a second surface 152 opposite the first surface 151 that will receive the electromagnetic radiation to be detected and/or measured.

The support 150 has the first layer 101 that is called the substrate, preferably made from an insulating or semiconducting dielectric material adapted to produce a low dark current and chosen to be transparent at the wavelengths of the radiation to be detected. The substrate 101 has a sufficient lattice match with the materials making up the active layer 102 so as to limit crystalline defects present in the first and second zones 110, 120 that are formed in it.

Thus, the substrate 101 may be made from cadmium and zinc telluride CdZnTe, for a structure adapted for the measurement and/or detection of electromagnetic radiation in the infrared range. This semiconducting material CdZnTe has a band gap energy of at least 1.4 eV, and is therefore transparent to infrared and is not very sensitive to thermal noise. According to this possibility, the substrate may also be made of cadmium telluride CdTe.

The substrate 101 has an approximately plane shape, with a first face forming the second surface 152 of the support and a second face opposite the first face.

In the case in which the substrate 101 is cadmium and zinc telluride, the concentration in majority carriers is preferably chosen to be low.

The support 150 also comprises the active layer 102 in contact with the substrate 101 on its second face. This active layer 102 is made from a semiconducting material for which the band gap energy is adapted for the detection and/or measurement of the electromagnetic radiation to be detected and/or measured.

The active layer 102 may be made from a semiconducting material such as a $Cd_xHg_{1-x}Te$ type alloy, where x is chosen to be between 0 and 1 depending on the wavelength of the radiation to be detected, for electromagnetic radiation to be detected in the infrared range.

The first, second and third zones 110, 120, 130 are formed in the active layer 102. This arrangement of the first, second and third zones 110, 120, 130 is made relative to the axis of revolution A-A such that these three zones 110, 120, 130 are concentric with each other.

The first zone 110 is the central zone of the structure 100 made around the axis of revolution A-A. The first zone 110 has a conductivity for which the majority carriers are holes 201. The concentration of majority carriers in the first zone 101 is preferably high, to enable electric polarisation of the first zone 110 by having low input resistance.

In the case in which the active layer 102 is made from a $Cd_xHg_{1-x}Te$ type semiconducting material, the conductivity of the first zone 110 may be defined by doping this first zone 110 with arsenic As.

The second zone 120 is a zone in lateral contact with the first zone 110. The conductivity of the second zone 120 is such that the majority carriers of the second zone 120 are electrons 202. Thus, since the first zone 110 is small relative to the second zone 120, the second zone has a high concentration of majority carriers, of the order of $10^{17}$ cm$^{-3}$ or more. The second zone 120 has a lower concentration of majority carriers, of the order of $10^{15}$ cm$^{-3}$, and preferably between $5 \times 10^{14}$ and $10^{16}$ cm$^{-3}$. The concentration of majority carriers in the second zone 120 may for example be obtained by doping with indium In when the material of the active layer 102 is a Cd$_x$Hg$_{1-x}$Te type alloy.

The second zone 120 surrounds the first zone 110. Contact between the first zone 110 and the second zone 120 is approximately lateral.

The first and the second zones 110, 120 together form a semiconducting junction at their contact. The semiconducting junction, due to the different concentrations in majority carriers in the first and second zones 110, 120, is an asymmetric junction. Since the concentration of majority carriers is lower in the second zone 120 than it is in the first zone 110, the space charge zone extends mainly on the least doped side, i.e. on the second zone 120.

Thus, for an inverse polarisation of the semiconducting junction, the generation of electron-hole pairs 202-201 in the junction takes place mainly in the second zone 120.

The third zone 130 surrounds the second zone 120. The third zone 130 is a zone with conductivity such that the majority carriers in the third zone 130 are electrons 202. The concentration of majority carriers in the third zone 130 is sufficient so that the semiconducting material from which it is made has a Moss-Burstein effect. In the case in which the active layer 102 is a Cd$_x$Hg$_{1-x}$Te type alloy, the concentration of majority carriers in the third zone 130 must be more than $10^{17}$ cm$^{-3}$ to have the Moss-Burstein effect.

The third zone is in contact with the second zone over the entire thickness of the second zone.

According to this case, the concentration of majority carriers in the third zone 130 is preferably greater than $10^{18}$ cm$^{-3}$. Such a concentration can be obtained by ion implantation of boron in the active layer for an active layer formed from a Cd$_x$Hg$_{1-x}$Te type alloy.

The third zone forms a means of limiting the lateral current adapted to limit the junction current for which the origin is lateral to the longitudinal plane, said means of limiting the lateral current at least partially surrounding the junction.

The structure 100 has a passivation layer 103 on the face of the active layer 102 opposite the second surface 152 of the support 150. For an active layer 102 formed from a Cd$_x$Hg$_{1-x}$Te type alloy, the passivation layer 103 may be formed for example from cadmium telluride CdTe and/or zinc sulphide ZnS.

The passivation layer 103 has an opening 105 at the first zone 110. This opening 105 forms an access to the first zone 110 to enable its connection to the polarisation pad 104.

The polarisation pad 104 is in contact with the passivation layer 103 on its face opposite the second surface 152 of the support 150. The polarisation pad 104 is also in electrical contact with the first zone 110 through the opening 105.

The polarisation pad 104 completely covers the second zone 120 and partially covers the third zone 103. The polarisation pad may be made from a conducting material with low contact resistance with the first zone 110.

For a first zone 110 made from a Cd$_x$Hg$_{1-x}$Te type alloy, the polarisation pad 104 may for example be made from gold Au, titanium Ti or chromium Cr.

Such a structure 100 may be fabricated using a fabrication process comprising the following steps:
provide a semiconducting support 150 comprising a substrate 101 and an active layer 102, the conductivity of the active layer 101 being such that the majority carriers of the active layer 101 are electrons 202,
implant ions in the first zone 110 in the active layer 102,
make an activation annealing of ions implanted in the first zone 110 so as to form the first and the second zones 110, 120, the second zone 120 having the conductivity of the active layer 102 and the first zone 110 having a conductivity such that the majority carriers of the first zone 110 are holes 201,
deposit the passivation layer 103 on the active layer 102,
make the opening 105 in the passivation layer 103 at the first zone 110,
deposit the polarisation pad 104 on the passivation layer 103 with contact between the polarisation pad 104 and the first zone 110,
ion implantation in the third zone 130 such that the conductivity of the third zone is such that the majority carriers of the third zone 130 are electrons, ion implantation of the third zone 130 being made such that the third zone surrounds and delimits the second zone 120.

According to one alternative to this fabrication process, it is also possible to make such a semiconducting structure 100 by performing the step to deposit the passivation layer 103 and to make the opening 105 of the passivation layer 103 before the ion implantation step of the first zone 110.

According to this alternative, since the formation of the opening 105 is obtained by means of an etching step through an insolated resin layer, this insolated resin layer (not shown) is used as a hard mask for ion implantation. The advantage of a process according to this alternative is that it limits the number of masking operations.

A semiconducting structure 100 as described above may be integrated into a semiconducting component comprising several semiconducting structures so as to provide an electromagnetic radiation detection and/or measurement device, not shown, capable of measuring spatial variations of the electromagnetic radiation.

FIG. 3 shows such a semiconducting component 10 comprising four semiconducting structures 100*c,d,e,f*.

Such a semiconducting component 10 has a support 150 common to the four semiconducting structures 100*c,d,e,f*. The four semiconducting structures 100*c,d,e,f* being distributed in columns and rows so as to form an electromagnetic radiation detection and/or measurement matrix.

The semiconducting structures 100*c,d,e,f* are in contact through their third zones. A peripheral electrical contact 14 is also provided on the semiconducting component 10, in electrical contact with the active layer 103 comprising the third zones of the semiconducting structures 130*c,d,e,f*.

Since the third zones 130*c,d,e,f* are zones with high conductivity, since the semiconducting material from which they are made is degenerated, the electrical contact 14 only is sufficient to polarise each of the third zones 130*,c,d,e,f* of the semiconducting structures 100*,c,d,e,f*.

Each of the semiconducting structures 100*a,b,c,d* may be polarised by the electrical contact common to all semiconducting structures 100*c,d,e,f* and through its metallic pad 105.

Such a configuration of the semiconducting component 10 is adapted to enable mounting of a semiconducting component 10 on a conventional semiconducting electronics such as a silicon component, this mounting possibly being made by hybridisation with indium.

The polarisation pads 105 of each semiconducting structure 100*c,d,e,f* are well separated because they are made on the single polarisation pad 105 that is dimensioned to be equivalent to the dimension of the first and/or second zones 110, 120 of the corresponding semiconducting structure 100*c,e,f*, therefore polarisation pads 105 can easily be connected without any interference of the contact of the third zone 130 that may be at a distance due to the conductivity of the third zones 130.

According to one possibility not shown, the component may comprise an electromagnetic radiation concentration system for each of the semiconducting structures 100c,d,e,f or for part of them. Such an electromagnetic radiation concentration system on the semiconducting structure 100c,d,e,f may be formed on the electromagnetic radiation path on the input side of the semiconducting structure 100c,d,e,f, or on the output side.

In an input side configuration, the concentration system such as a lens may increase the proportion of the electromagnetic radiation that converges on the junction.

In an output side configuration, the concentration system such as a convergent mirror is capable of retrieving the part of the electromagnetic radiation not absorbed by the semiconducting structure 100c,d,e,f, like that passing through the third zone 130 made transparent by the Moss-Burstein effect, and making it converge at the semiconducting junction.

This latter possibility becomes particularly attractive in the scope of the invention, since devices according to prior art do not have a third zone 130 made transparent by the Moss-Burstein effect.

The input side or output side concentration system forms a means of concentrating electromagnetic radiation received by the semiconducting component on the semiconducting junction.

Figure 4:
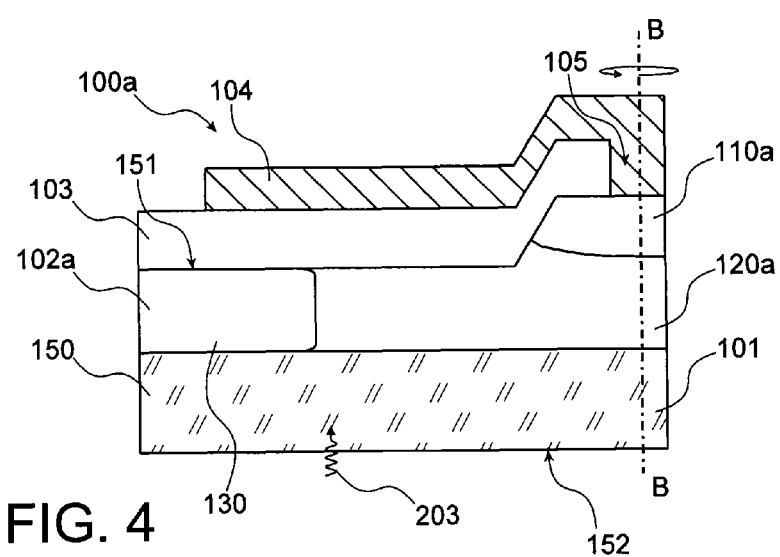

FIG. 4 shows a second embodiment of a semiconducting structure 100. Such a semiconducting structure 100a is different from the first embodiment in that only the second and third zones 120a, 130 are formed in the active layer 102a, the first zone 110a being formed in a formation layer on the second zone 120a and said formation layer being formed from a material different from the material from which the second and the third zones 120a, 130 are formed, the semiconducting junction being approximately along a generally longitudinally oriented surface.

In this embodiment, the second zone 120a is a central zone of the semiconducting structure 100 centred on the axis of revolution B-B. The first zone 110a is a zone in contact with the face of the active layer 102a opposite the second surface 152 of the support 150. The first zone 110a projects from the active layer 102a.

The first zone 110a is preferably adapted to have a low coefficient of absorption at the wavelength to be detected and/or measured by making it from a semiconducting material different from that used to make the active layer 102a. Thus, for a material in the active layer 102a of the $Cd_xHg_{1-x}Te$ type, the first zone 110a may be made from a material of the same type with a value of x greater than the value for the active layer 102a.

For a $Cd_xHg_{1-x}Te$ type semiconducting material, an increase in the value of x will result in opening of the band gap and therefore a reduction in the absorption of said material at long wavelengths.

As shown in FIG. 4, the passivation layer 103 is deposited partly on the active layer 102a and partly on the first zone 110a.

The fabrication process for a semiconducting structure 100a according to this second embodiment includes steps to:
provide a semiconducting support 150 comprising a substrate, an active layer 102a and a formation layer of the first zone 110a, not shown, the active layer 102a having a conductivity such that the majority carriers of the active layer are electrons 202 and the formation layer has a conductivity such that the majority carriers are holes 201, the active layer 102a and the formation layer preferably being made from two different materials, the formation layer preferably being made from a material with a larger gap than the active layer 102a,
etch part of the formation layer so as to form the first zone 110a,
deposit the passivation layer 103 on the active layer 102a and the first zone 110a,
make the opening 105 of the passivation layer 103 at the first zone 110a,
deposit the polarisation pad 104 on the active layer 102a with a contact between the polarisation pad 104 and the first zone 110a,
make an ion implantation of the third zone 130 such that the conductivity of the third zone 130 is such that the majority carriers of the third zone are electrons 202, the implantation of the third zone 130 being made such that it surrounds and delimits the second zone 120a.

In the same way as a semiconducting structure 110 according to the first embodiment, a semiconducting structure 110a according to this second embodiment may be integrated into a semiconducting component 10 comprising a plurality of semiconducting structures 100c,d,e,f, regardless of whether or not this semiconducting component 10 comprises electromagnetic radiation concentration systems.

Figure 5:
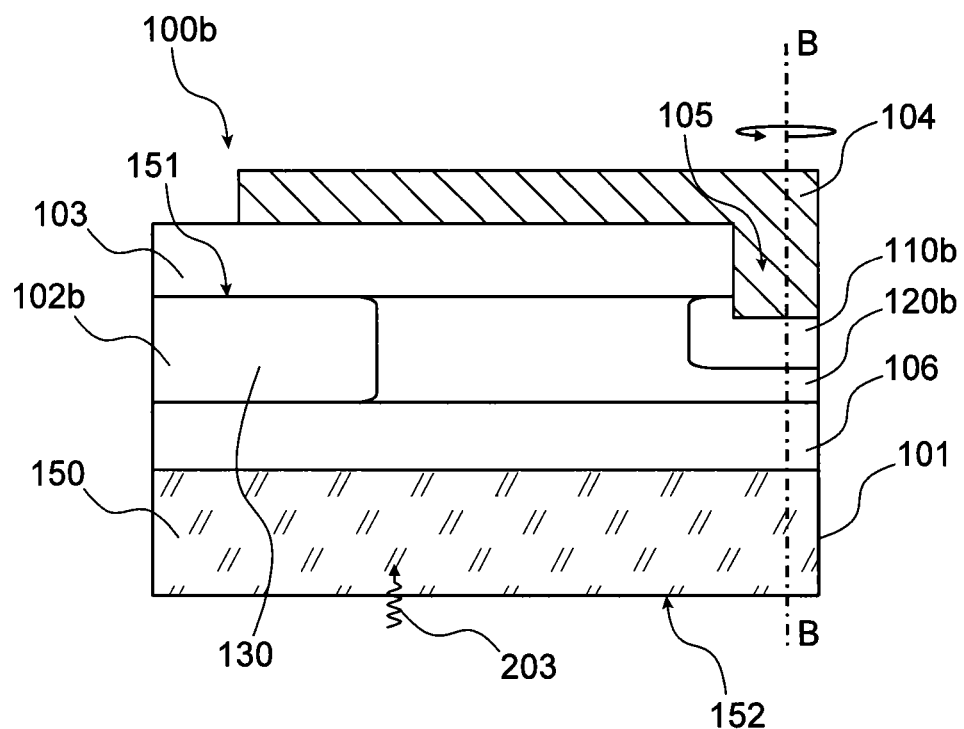

FIG. 5 shows a semiconducting structure 100b according to a third embodiment. Such a semiconducting structure 100b is different from a semiconducting structure 100 according to the first embodiment in that the first zone 110b is formed on part of the thickness of the active layer 102b comprising the first surface 151 of the semiconducting support 150, the remainder of the thickness of the active layer 102b at the first zone 110b being part of the second zone 120b. This semiconducting structure 100b is also different from a semiconducting structure 100 according to the first embodiment in that it comprises a confinement layer 106 between the substrate 101 and the active layer 102b.

In this embodiment, the first zone 110b is a central zone present on only part of the thickness of the active layer 102b and comprising the surface of the active layer 102b in contact with the passivation layer 103. The second zone 120b comprises the part of the active layer 102b that is between the first zone 110b and the confinement layer 106. Thus, the first zone 110b is contained in the second zone 120b. The first and the second zones 110b, 120b are in contact on an approximately longitudinal junction plane and also at a lateral junction around the entire periphery of the first zone 110b. The first zone 110b is at a distance from the face of the active layer 102b opposite the first surface 151 of the semiconducting support 150.

The confinement layer 106 is in contact with the substrate 101 and the active layer 102b. The confinement layer is at the interface between the substrate 101 and the active layer 102b. The confinement layer 106 is in longitudinal contact with the active layer 102b on the face of the active layer 102b that is opposite the first surface 151 of the semiconducting support 150.

The confinement layer 106 is a layer for which the properties are approximately identical to the properties of the third zone 130. Thus, the confinement layer 106 has the same type of conductivity as the third zone 130 with the same order of magnitude of the concentration of majority carriers. The thickness of the confinement layer 106 is between 2 and 3 µm.

The semiconducting structure fabrication process according to this third embodiment is different from the semiconducting structure fabrication process according to the first embodiment in that in the step to supply the semiconducting support, the support is provided with a confinement layer and in that the step to make an ion implantation of the first zone 110 in the active layer 102 is only made on part of the thickness of the active layer 102b.

Although the semiconducting material of the active layer 102 and the first zone 110, 110a, 110b are chosen as being $Cd_xHg_{1-x}Te$ type semiconducting materials in these three embodiments, the semiconducting materials of the active layer 102 and the first zone 110, 110a, 110b may be another semiconducting material adapted to the wavelength of the electromagnetic radiation to be detected and/or measured, such as indium antimonide InSb for infrared or InAsSb and InGaAs, without going outside the scope of the invention. According to this possibility, the support 150 is chosen as a function of the semiconducting material from which the active layer 103 is made, in other words in the case of InSb preferably a support 150 made of InSb, in the case of InAsSb a support 150 made of GaAs, and in the case of InGaAs a support 150 made of InP.

According to another possibility not shown and not described in the above embodiments, a fourth zone in contact with the first zone 110, 110a with the same type of conductivity as the first zone 110, 110a, 110b may also be provided, the fourth zone having a greater concentration of majority carriers than the first zone 110, 110a, 110b.

If the semiconducting structures 100, 100a are semiconducting structures of revolution in the three embodiments described above, the semiconducting structure 100, 100a, 100b may be in a shape other than a shape of revolution such as a cubic shape, without going outside the scope of the invention provided that the third zone 130 at least partially laterally surrounds a junction formed by a first zone 110, 110a, 110b and a second zone 120, 120a, 120b.

[1] K. Jozwikowski, Journal of Electronic Materials, Volume 38, Number 8, pp 1666-1676, DOI: 10.1007/s11664-009-0752-0

[2] H. F. Schaake and Al, Journal of Electronic Materials, Volume 37, Number 9, pp 1401-1405, DOI: 10.1007/s11664-008-0423-6

The invention claimed is:

1. A semiconducting structure configured to receive electromagnetic radiation and transform the received electromagnetic radiation into an electric signal, the semiconducting structure comprising:
a semiconducting support with a first and a second surface, the first surface defining a longitudinal plane;
a first zone including a first type of conductivity formed in the support;
a second zone including a second type of conductivity that is opposite of the first type of conductivity, the second zone being formed in the support in contact with the first zone to form a semiconducting junction with the first zone;
a third zone formed in the support in lateral contact with the second zone and configured to limit junction current that originates laterally to the longitudinal plane, the third zone at least partially surrounding the junction;
the third zone having the second type of conductivity, the second type of conductivity being a conductivity for which majority carriers are electrons, the third zone comprising a degenerated semiconductor material.

2. The semiconducting structure according to claim 1, wherein the third zone surrounds the junction.

3. The semiconducting structure according to claim 1, further comprising a fourth zone in contact with the first zone with same type of conductivity as the first zone, the fourth zone having a greater concentration of majority carriers than the first zone.

4. The semiconducting structure according to claim 1, wherein the second zone surrounds the first zone, the third zone surrounding the second zone.

5. The semiconducting structure according to claim 1, wherein the first zone and the second zone are in contact on an approximately longitudinal junction plane.

6. The semiconducting structure according to claim 5, wherein the first, second, and third zones are formed in a support layer as an active layer, the active layer comprising the first surface of the semiconducting support and the first zone being at a distance from a face of the active layer opposite the first surface of the semiconducting support,
the semiconducting structure further comprising a confinement layer, formed in the semiconducting support in longitudinal contact with the active layer on a face of the active layer opposite the first surface of the semiconducting support, the confinement layer having the second type of conductivity, the confinement layer comprising the degenerated semiconductor material.

7. The semiconducting structure according claim 1, further comprising means for electric polarization of the first zone formed on the first surface, the second surface configured to receive electromagnetic radiation.

8. The semiconducting structure according to claim 1, wherein at least one of the first zone and the second zone is made from a semiconducting material different from the material used for the other zone among the first zone and second zone such that the structure forms a heterostructure.

9. The semiconducting structure according to claim 1, wherein at least one of the zones among the first, second, and third zones is made from a semiconducting material selected from among InSb and semiconductors of $InAs_xSb_{1-x}$, $In_xGa_{1-x}As$ and $Cd_xHg_{1-x}Te$ type where x is between 0 and 1.

10. A semiconducting component comprising a semiconducting support on which a plurality of semiconducting structures are formed, wherein at least one of the semiconducting structures is a semiconducting structure according to claim 1.

11. The semiconducting component according to claim 10, wherein the at least one of the semiconducting structures includes all of the semiconducting structures, the third zones of the semiconducting structures being in contact with each other.

12. The semiconducting component according to claim 1, further comprising means for concentrating electromagnetic radiation to concentrate light received by the semiconducting component on the semiconducting junction, formed in the semiconducting component facing the first surface of the semiconducting support.

13. A method for fabricating a semiconducting structure for fabrication of a semiconducting structure configured to receive electromagnetic radiation and transform the received electromagnetic radiation into an electric signal, the method comprising:
provide a semiconducting support with a first and a second surface, the first surface defining a longitudinal plane;
forming a first zone with a first type of conductivity in the semiconducting support;
forming a second zone with a second type of conductivity, that is opposite of the first type of conductivity of which the majority carriers are electrons, in the semiconducting support in contact with the first zone so as to form a semiconducting junction;
forming a third zone with the second type of conductivity being a conductivity for which majority carriers are electrons, in lateral contact with the second zone, the third zone configured to limit junction current that originates laterally to the longitudinal plane, at least partially surrounding the junction, and comprising a degenerated semiconductor material.

14. The method for fabricating a semiconducting structure according to claim 13, wherein formation of the first and second zones are made simultaneously by forming the first zone in a support layer with the conductivity of the type of the second zone.

15. The method for fabricating a semiconducting structure according to claim 13, wherein the first layer is formed including etching a formation layer of the first layer in contact with the second layer to form the semiconducting junction.

* * * * *